(12) United States Patent
Kim (10) Patent No.: US 7,230,866 B2
(45) Date of Patent: Jun. 12, 2007

(54) INTEGRATED CIRCUIT DEVICES HAVING PRECHARGE AND EQUALIZATION CIRCUITS THEREIN AND METHODS OF OPERATING SAME

(75) Inventor: Dae-Hwan Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 11 days.

(21) Appl. No.: 11/329,660

(22) Filed: Jan. 11, 2006

(65) Prior Publication Data

US 2006/0171223 A1 Aug. 3, 2006

(30) Foreign Application Priority Data

Jan. 28, 2005 (KR) ...................... 10-2005-0007867

(51) Int. Cl.
*G11C 7/12* (2006.01)
(52) U.S. Cl. ...................... 365/203; 365/190
(58) Field of Classification Search .................. 365/204
See application file for complete search history.

(56) References Cited

U.S. PATENT DOCUMENTS

| | | | |
|---|---|---|---|
| 4,658,381 A * | 4/1987 | Reed et al. .................. | 365/203 |
| 5,412,605 A * | 5/1995 | Ooishi ........................ | 365/203 |
| 5,572,473 A * | 11/1996 | Robertson .................... | 365/202 |
| 6,041,003 A | 3/2000 | Casper et al. | |
| 6,281,713 B1 | 8/2001 | Kim | |
| 6,493,275 B2 | 12/2002 | Tomita | |

* cited by examiner

*Primary Examiner*—Tan T. Nguyen
(74) *Attorney, Agent, or Firm*—Myers Bigel Sibley & Sajovec, PA (57) ABSTRACT

An integrated circuit device may include an equalization transistor having first and second current carrying terminals electrically coupled to first and second signal lines, respectively, and a gate terminal responsive to an enable signal. A first body voltage control circuit may also be provided. This control circuit includes a first transistor having a first current carrying terminal electrically connected to the first signal line, a second current carrying terminal electrically connected to a body terminal of the equalization transistor and a gate terminal electrically connected to the second signal line. This first body voltage control circuit may operate to boost a voltage of the body terminal during an equalization time interval and thereby inhibit threshold voltage increases in the equalization transistor, which may limit operating speed of the integrated circuit device. The first body voltage control circuit may also include a second transistor having a first current carrying terminal electrically connected to the second signal line, a second current carrying terminal electrically connected to the body terminal of the equalization transistor and a gate terminal electrically connected to the first signal line.

15 Claims, 6 Drawing Sheets

INTEGRATED CIRCUIT DEVICES HAVING PRECHARGE AND EQUALIZATION CIRCUITS THEREIN AND METHODS OF OPERATING SAME

REFERENCE TO PRIORITY APPLICATION

This application claims priority to Korean Application Serial No. 2005-0007867, filed Jan. 28, 2005, the disclosure of which is hereby incorporated herein by reference.

FIELD OF THE INVENTION

The present invention relates to integrated circuit devices and, more particularly, to integrated circuit devices having voltage precharge circuits therein.

BACKGROUND OF THE INVENTION

A semiconductor memory device typically has multiple internal signal lines for storing data in memory cells and outputting the data. Among the signal lines, a pair of data input and output lines is at the same voltage in a precharged state and at a complementary voltage during writing and reading operation. In writing and reading successive data, the data is written or output depending on a burst length. In order to write or read subsequent data, the data input and output line pair should be equalized and precharged to the same voltage.

Figure 1:
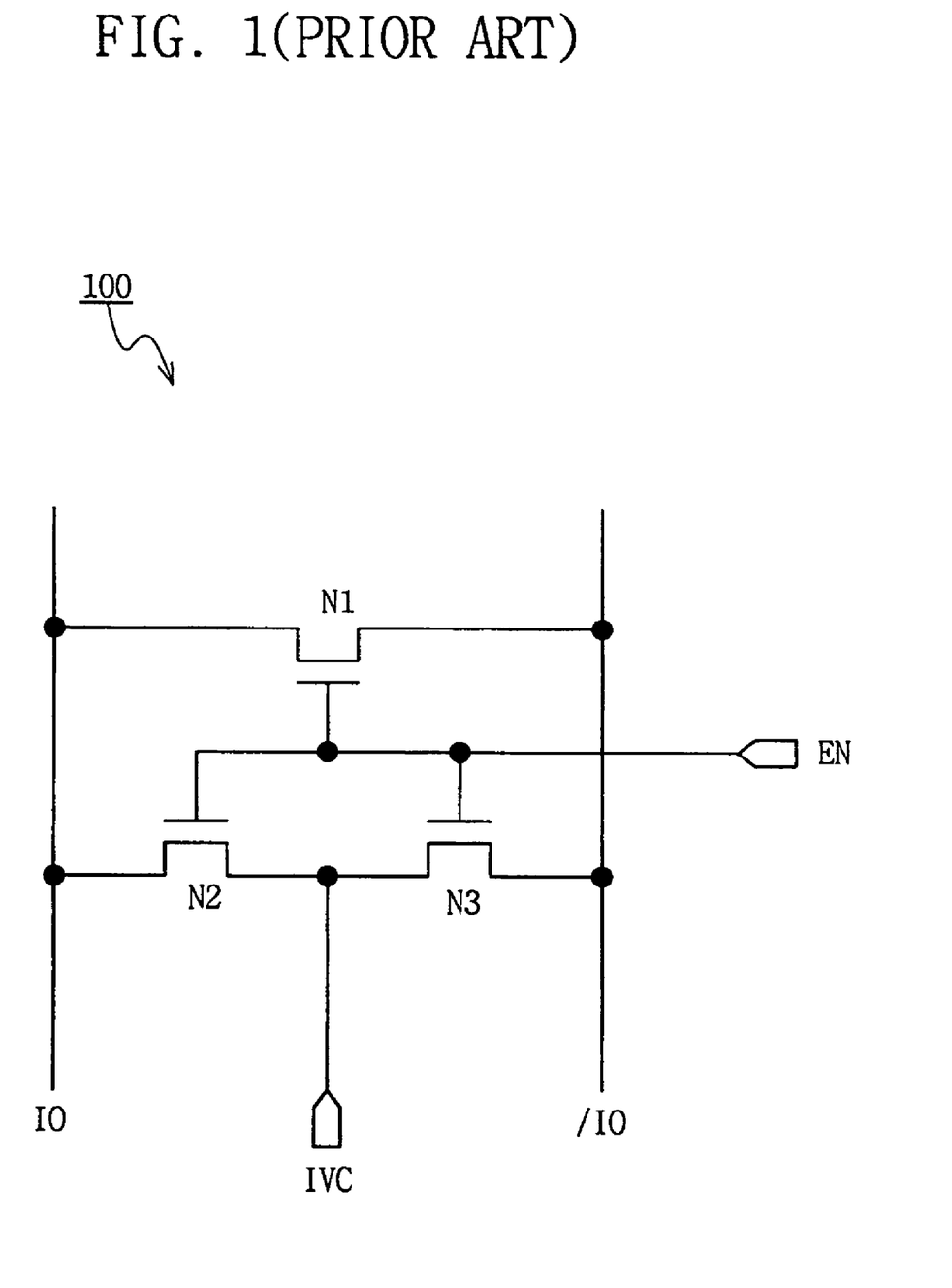
FIG. 1 is an electrical schematic of a conventional equalization circuit.

FIG. 1 illustrates an equalizing and precharging circuit for a typical semiconductor device. Referring to FIG. 1, an equalizing and precharging circuit 100 is composed of a first data line IO, a second data line /IO, a first equalizing transistor N1 connected between the data lines for equalizing the data lines in response to an enable signal EN, and second and third precharging transistors N2 and N3 for precharging the data lines to a certain voltage in response to the enable signal EN. The first, second and third transistors have body terminals connected to a ground voltage.

Operation of the equalizing and precharging circuit 100 of FIG. 1 will be described. In a precharged state of the semiconductor device, the enable signal EN becomes active. Accordingly, the equalizing transistor N1 and the precharging transistors N2 and N3 are turned on, precharging the data lines IO and /IO to a certain voltage, i.e., an internal power supply voltage IVC. In the writing and reading operation, the enable signal EN becomes inactive. This turns the equalizing transistor N1 and the precharging transistors N2 and N3 off, enabling a writing driver and a data sense amplifier (not shown) to supply a complementary voltage to each data line IO and /IO. In order to write and read subsequent data depending on a burst length, the data lines should be again equalized and precharged to the internal power supply voltage IVC.

In the equalizing and precharging circuit 100 as shown in FIG. 1, a voltage on the data line acting as a source of the precharging transistor N2 or N3 increases with the equalizing and precharging operation, thereby reducing Vgs of the precharging transistors. In addition, a threshold voltage Vth of the precharging transistors increases with an increasing source voltage due to a body effect ($Vth \propto \sqrt{Vbs}$) since the body regions of the precharging transistors N2 and N3 are fixed at the ground voltage. This threshold voltage increase degrades driving capability of the precharging transistors and the precharge speed of the data lines to the internal power supply voltage. Similarly, since Vgs of the equalizing transistor N1 decreases with an increasing voltage on the data line acting as the source and the body of the equalizing transistor N1 is fixed at the ground voltage, the threshold voltage Vth increases due to the body effect. This degrades the driving capability of the equalizing transistor and the equalizing speed of the data lines.

The above-described equalizing and precharging operation degrade the equalizing and precharging speed of the data input and output lines, such that the equalizing and precharging speed of the data input and output lines limits the operation frequency of a semiconductor device requiring high-speed writing and reading operations.

SUMMARY OF THE INVENTION

Embodiments of the present invention include integrated circuit devices having signal lines therein that undergo precharge and/or equilibration operations. According to some of these embodiments, an integrated circuit device may include an equalization transistor having first and second current carrying terminals (e.g., source and drain terminals) electrically coupled to first and second signal lines, respectively, and a gate terminal responsive to an enable signal. The first and second signal lines may be complementary data lines (e.g., IO, /IO) or complementary bit lines (e.g., B, /B), for example, and the integrated circuit device may be a memory device (e.g., DRAM, SRAM, nonvolatile, etc.). These signal lines may switch rail-to-rail (e.g., Vss-to-Vdd) during operation of the integrated circuit device. The integrated circuit device may also include a first body voltage control circuit. This control circuit includes a first transistor having a first current carrying terminal electrically connected to the first signal line, a second current carrying terminal electrically connected to a body terminal of the equalization transistor and a gate terminal electrically connected to the second signal line. This first body voltage control circuit may operate to boost a voltage of the body terminal during an equalization time interval and thereby inhibit threshold voltage increases in the equalization transistor, which may limit operating speed of the integrated circuit device. The first body voltage control circuit may also include a second transistor having a first current carrying terminal electrically connected to the second signal line, a second current carrying terminal electrically connected to the body terminal of the equalization transistor and a gate terminal electrically connected to the first signal line.

In addition to the equalization transistor, the integrated circuit device may include a first precharge transistor having a first current carrying terminal electrically connected to the first signal line, a second current carrying terminal electrically connected to a precharge voltage line (e.g., IVC, which may equal Vdd/2) and a gate terminal responsive to the enable signal. A second body voltage control circuit may accompany this first precharge transistor. This second body voltage control circuit includes a first transistor having a first current carrying terminal electrically connected to the first signal line, a second current carrying terminal electrically connected to a body terminal of the first precharge transistor and a gate terminal electrically connected to the precharge voltage line. The second body voltage control circuit may also include a second transistor having a first current carrying terminal electrically connected to the precharge voltage line, a second current carrying terminal electrically connected to the body terminal of the first precharge transistor and a gate terminal electrically connected to the first signal line.

Additional embodiments of the invention include an integrated circuit device with a precharge transistor having a first current carrying terminal electrically connected to a first signal line, a second current carrying terminal electrically connected to a precharge voltage line and a gate terminal responsive to an enable signal. A body voltage control circuit is also provided to inhibit unwanted increases in the threshold voltage of the precharge transistor. This body voltage control circuit includes a first transistor having a first current carrying terminal electrically connected to the first signal line, a second current carrying terminal electrically connected to a body terminal of the precharge transistor and a gate terminal electrically connected to the precharge voltage line. The body voltage control circuit may also include a second transistor having a first current carrying terminal electrically connected to the precharge voltage line, a second current carrying terminal electrically connected to the body terminal of the precharge transistor and a gate terminal electrically connected to the first signal line.

Further embodiments of the invention include methods of operating an integrated circuit devices. These methods may be used in memory devices that utilize differential data lines that may be driven rail-to-rail during writing, reading and other data transfer operations. In particular, the methods may include equilibrating voltages on a pair of complementary data lines using an equalization transistor connected across the pair of complementary data lines. This operation is done simultaneously with raising a voltage on a body terminal of the equalization transistor by electrically connecting the body terminal to a first one of the pair of complementary data lines. In particular, the step of equilibrating includes raising a voltage on a body terminal of the equalization transistor by electrically connecting the body terminal to a first one of the pair of complementary data lines during a leading portion of an equalization time interval (when an enable signal is initially activated) and electrically connecting the body terminal to a second one of the pair of complementary data lines during a trailing portion of the equalization time interval (before the enable signal is deactivated).

Additional methods of operating an integrated circuit device may include precharging a signal line using a precharge transistor connected between the signal line and a precharge voltage line while simultaneously raising a voltage on a body terminal of the precharge transistor by increasing a conductivity of an electrical connection between the body terminal and the precharge voltage line in response to an increase in voltage on the signal line.

DETAILED DESCRIPTION OF PREFERRED EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figure 2:
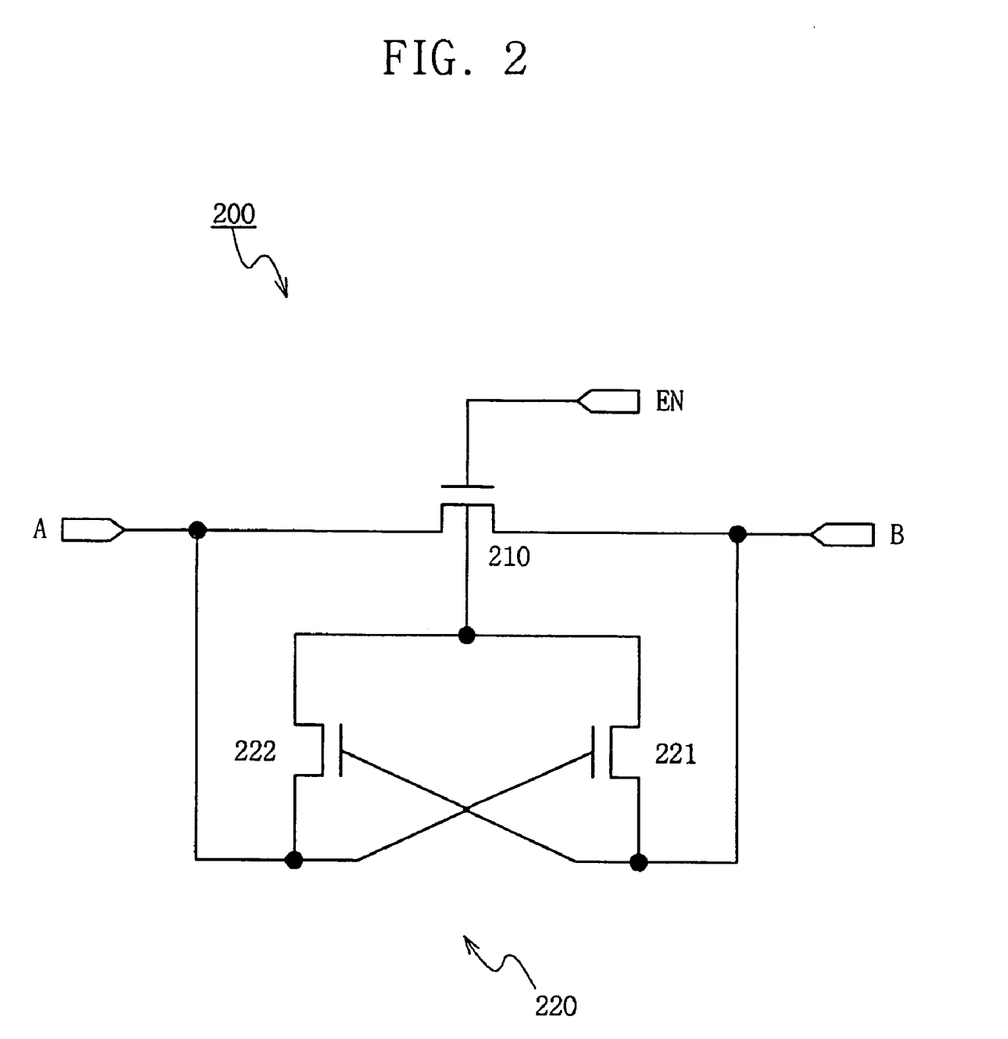
FIG. 2 is an electrical schematic of an equalization circuit according to an embodiment of the present invention.

FIG. 2 is a circuit diagram of an equalizing circuit according to an embodiment of the present invention. Referring to FIG. 2, an equalizing circuit 200 includes a first signal line A, a second signal line B, an equalizing transistor 210 and a body voltage control circuit 220. The equalizing transistor 210, which connects to the first signal line A and the second signal line B, equalizes voltages on the lines in response to an enable signal EN.

The body voltage control circuit 220 includes a first transistor 221 having a gate connected to the first signal line A, a first terminal connected to the second signal line B, and a second terminal connected to a body of the equalizing transistor 210. The body voltage control circuit may further include a second transistor 222 having a gate connected to the second signal line B, a first terminal connected to the first signal line A, and a second terminal connected to the body of the equalizing transistor 210.

Operation of the equalizing circuit 200 will be now described. It is assumed that equalization is performed after a power supply voltage is applied to the first signal line A and a ground voltage is applied to the second signal line B. When the enable signal EN becomes active, the equalizing transistor 210 is turned on and the power supply voltage on the first signal line A begins to be equalized to the ground voltage on the second signal line B and the voltage on the second signal line B begins to increase. Preferably, the voltage of the enable signal EN is greater than the power supply voltage plus a threshold voltage Vth of the equalizing transistor 210. Since the power supply voltage on the first signal line A is applied to the gate of the first transistor 221 to turn the first transistor 221 on, the body voltage of the equalizing transistor 210 (connected to the second terminal of the first transistor 221) increases with the increasing voltage on the second signal line B. Accordingly, the voltage on the second signal line B, which is a source voltage of the equalizing transistor 210, increases with the body voltage and suppresses the increase of the threshold voltage Vth of the equalizing transistor 210 due to the body effect and also prevents degradation of the driving capability of the equalizing transistor 210.

When the voltage level on the second signal line B increases to the equalizing voltage level, the second transistor 222 is turned on and contributes to the increase in the body voltage of the equalizing transistor 210 in cooperation with the first transistor 221. This suppresses the increase of the threshold voltage Vth of the equalizing transistor 210 due to the body effect, thereby preventing the degradation of equalizing speed.

Next, operation of the equalizing circuit 200 when the power supply voltage is applied to the second signal line B and the ground voltage is applied to the first signal line A will be described. When the enable signal EN becomes active, the equalizing transistor 210 is turned on, the power supply voltage on the second signal line B begins to be equalized to the ground voltage on the first signal line A, and the voltage on the first signal line A begins to increase. Since the power supply voltage on the second signal line B is applied to the gate of the second transistor 222 to turn the second transistor 222 on, the body voltage of the equalizing transistor 210 connected to the second terminal of the second transistor 222 increases with the increasing voltage on the first signal line A. This suppresses the increase of the threshold voltage Vth of the equalizing transistor 210 due to the body effect, thereby preventing degradation of driving capability of the equalizing transistor 210. When the voltage level on the first signal line A increases to the equalizing voltage, the first transistor 221 is turned on and contributes to increase of the body voltage of the equalizing transistor 210 in cooperation with the second transistor 222.

Because the body voltage of the equalizing transistor 210 increases with the feedback voltage from the equalized signal line, the equalizing circuit of FIG. 2 suppresses the increase of the threshold voltage Vth of the equalizing transistor 210 due to the body effect, thereby preventing degradation in the driving capability of the equalizing transistor.

Figure 3:
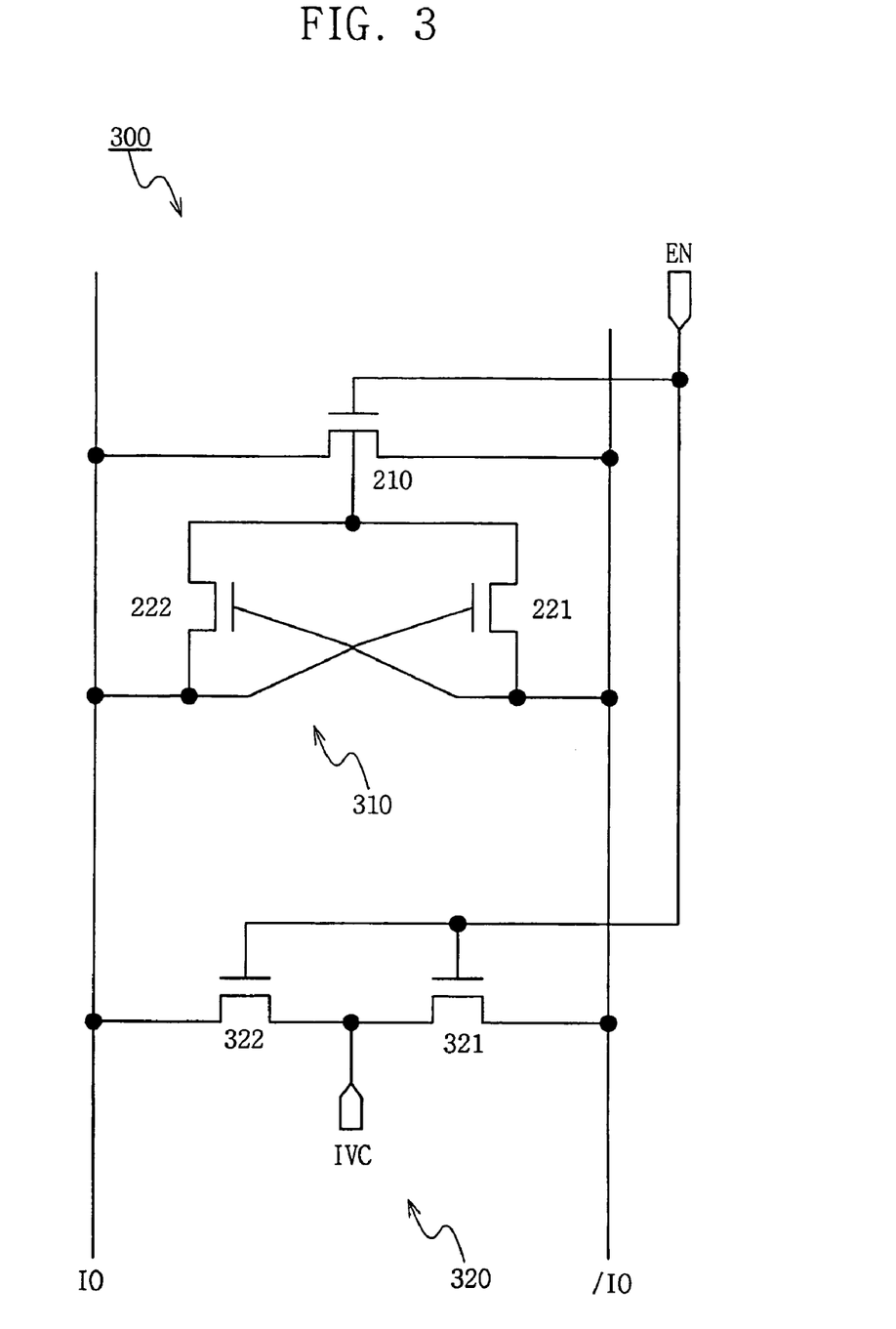
FIG. 3 is an electrical schematic of an equalization and precharge circuit according to an embodiment of the present invention.

FIG. 3 illustrates an embodiment in which an equalizing and precharging circuit for a semiconductor device employs the circuit 200 of FIG. 2 as an equalizing circuit. Referring to FIG. 3, an equalizing and precharging circuit 300 for a semiconductor device comprises a first data signal line IO, a second data signal line /IO, an equalizing circuit 310 and a precharging circuit 320. The equalizing circuit 310 has the same structure as the equalizing circuit 200 of FIG.2. The precharging circuit 320 is connected between the data signal lines IO and /IO and includes third and fourth transistors 321 and 322 for supplying a certain precharge voltage to the data signal lines in response to an enable signal EN. Preferably, the precharge voltage is the same as an internal power supply voltage IVC for the semiconductor device.

Operation of the equalizing and precharging circuit 300 of FIG. 3 will be described. It is assumed that the internal power supply voltage is applied to the first data signal line IO and a ground voltage is applied to the second data signal line /IO to perform equalizing and precharging. When the enable signal EN becomes high, the third transistor 321 of the precharging circuit 320 is turned on and the precharge voltage IVC is supplied to the second data signal line. An equalizing transistor 210 of the equalizing circuit 310 is also turned on and the voltages on the data signal lines IO and /IO begin to be equalized. The voltage on the second data signal line /IO increases as the equalizing transistor 210 and the third transistor 321 are turned on for the equalizing and precharging operation. A first activated transistor 221 of the equalizing circuit 310 increases the body voltage of the equalizing transistor 210. The increase of the equalized and precharged voltage on the second data signal line /IO, which acts as a source of the equalizing transistor 210, is accompanied with the increased body voltage of the equalizing transistor 210, thereby suppressing the increase of the threshold voltage Vth of the equalizing transistor 210 due to a body effect.

When the voltage on the first data signal line IO is reduced by the threshold voltage Vth from the internal power supply voltage IVC by means of the equalizing circuit 310, the fourth transistor 322 is turned on to supply the precharge voltage IVC to the first data signal line IO. The second data signal line /IO is connected to the gate of the second transistor 222 in the equalizing circuit 310 and increases to the precharge voltage IVC, thus turning the second transistor 222 on and supplying the precharge voltage IVC on the first data signal line IO to the body of the equalizing transistor 210. This increases the body voltage of the equalizing transistor 210 in cooperation with the first transistor 221 of the equalizing circuit 310, thereby suppressing the increase of the threshold voltage Vth due to a body effect appearing in the equalizing and precharging operation of FIG. 1 and in turn improving an equalizing and precharging speed.

Figure 4:
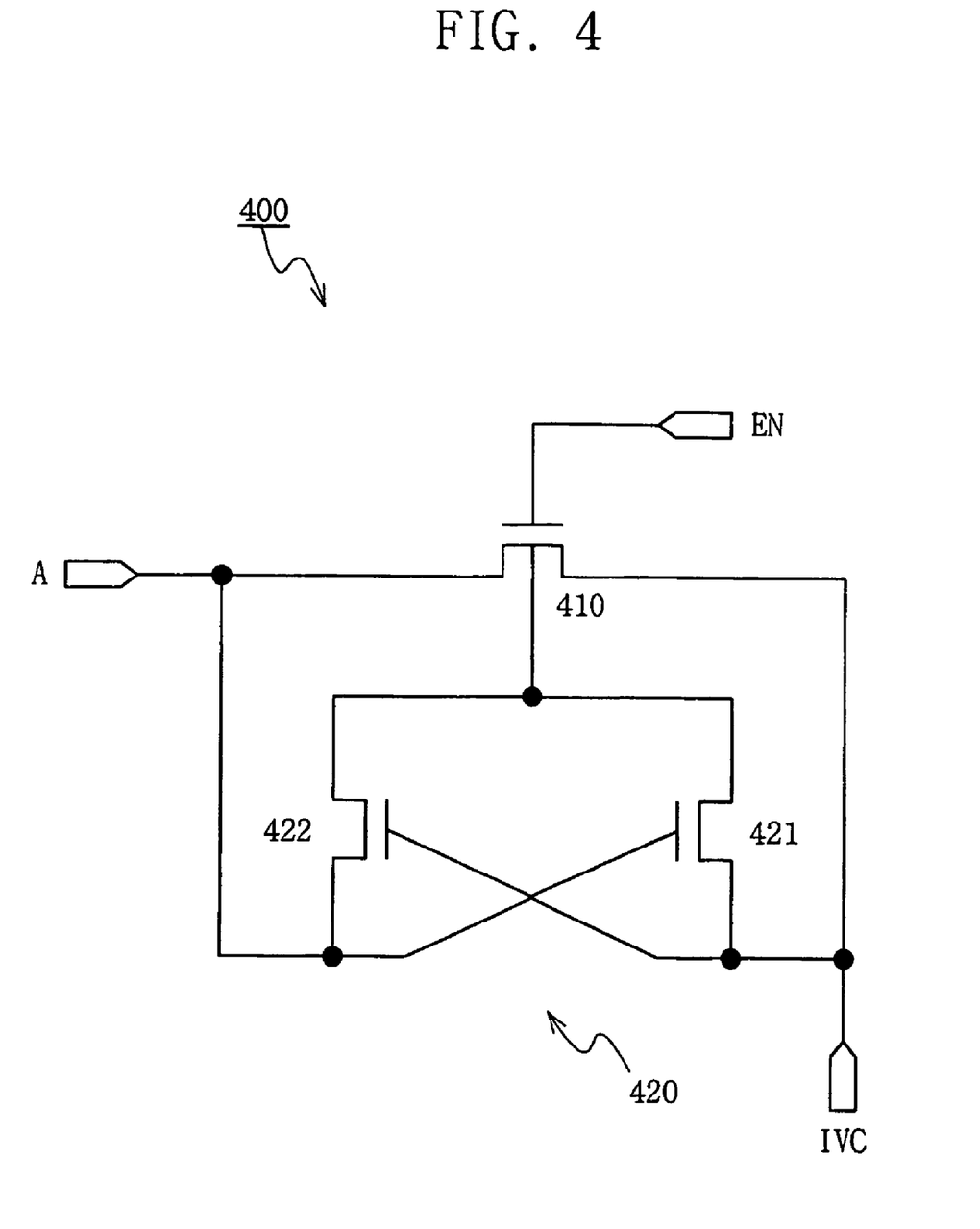
FIG. 4 is an electrical schematic of a precharge circuit according to an embodiment of the present invention.

FIG. 4 is a circuit diagram of a precharging circuit 400 according to the present invention. This circuit 400 is the same as shown in FIG. 2 except that a precharge voltage IVC is substituted for the second signal line of FIG. 2. Referring to FIG. 4, a precharging circuit 400 includes a first signal line A, a precharging transistor 410 having a gate connected to an enable signal EN, a first terminal connected to the first signal line and a second terminal connected to the precharge voltage IVC, and body voltage control circuit 420. The body voltage control circuit 420 includes a first transistor 421 having a gate connected to the first signal line, a first terminal connected to the precharge voltage, and a second terminal connected to a body of the precharging transistor 410. The body voltage control circuit may further comprise a second transistor 422 having a gate connected to the precharge voltage IVC, a first terminal connected to the first signal line, and a second terminal connected to the body of the precharging transistor 410.

Operation of the precharging circuit 400 according to an embodiment of the present invention will be described. It is assumed that precharging operation is performed after a ground voltage is applied to the first signal line A. If the enable signal EN becomes active, the precharge voltage IVC is supplied to the first signal line A via the precharging transistor 410 and the voltage on the first signal line A begins to increase. Since the precharge voltage is applied to the gate of the second transistor 422 of the body voltage control circuit 420 and turns the second transistor 422 on, the body voltage of the precharging transistor 410 increases with the increasing voltage on the first signal line A. In addition, the increasing voltage on the first signal line A turns the first transistor 421 on, supplying the precharge voltage IVC to the body voltage of the precharging transistor. Thus, with the precharging circuit 400, the precharged voltage on the signal line is fed back to the body voltage of the precharging transistor 410, thereby suppressing the increase of the threshold voltage Vth due to the body effect encountering at the equalizing and precharging circuit of FIG. 1 and in turn improving precharge speed of the signal line.

Figure 5:
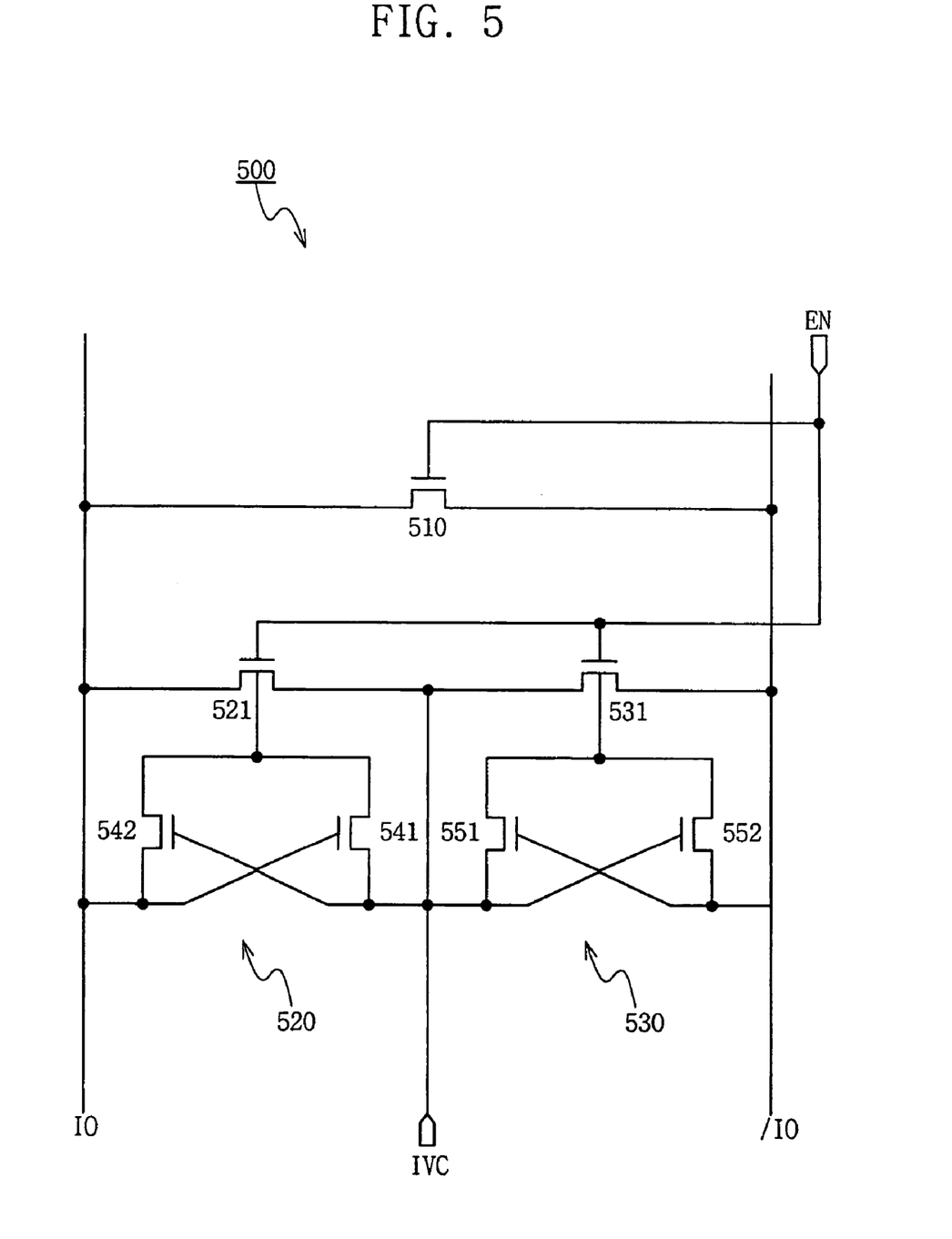
FIG. 5 is an electrical schematic of an equalization and precharge circuit according to an embodiment of the present invention.

FIG. 5 illustrates an embodiment in which the precharging circuit 400 of FIG. 4 is employed as a precharging circuit for a data line. Referring to FIG. 5, the equalizing and precharging circuit 500 includes a first data signal line IO, a second data signal line /IO, an equalizing transistor 510 and first and second precharging circuits 520 and 530. The equalizing transistor 510 connects between the first data signal line IO and the second data signal line /IO to equalize voltages thereon in response to an enable signal EN. The first precharging circuit 520 includes a first precharging transistor 521 having a gate connected to the enable signal EN, a first terminal connected to the first data signal line IO, a second terminal connected to a precharge voltage IVC and first body voltage control circuit. The first body voltage control circuit includes a first transistor 541 having a gate connected to the first data signal line, a first terminal connected to a body of the first precharging transistor 521, and a second terminal connected to the precharge voltage IVC; and a second transistor 542 having a gate connected to the precharge voltage IVC, a first terminal connected to the body of the first precharging transistor 521, and a second terminal connected to the first data signal line.

The second precharging circuit 530 includes a second precharging transistor 531 having a gate connected to the enable signal EN, a first terminal connected to the second data signal line /IO, and a second terminal connected to the precharge voltage IVC; and second body voltage control circuit 550. The second body voltage control circuit includes a third transistor 551 having a gate connected to the second data signal line, a first terminal connected to a body of the second precharging transistor 531, and a second terminal connected to the precharge voltage IVC; and a fourth transistor 552 having a gate connected to the precharge voltage IVC, a first terminal connected to the body of the second precharging transistor 531, and a second terminal connected to the second data signal line.

Operation of the equalizing and precharging circuit 500 of FIG. 5 will be now described. It is assumed that equalizing and precharging operation is performed after the internal power supply voltage is applied to the first data signal line IO and a ground voltage is applied to the second data signal line /IO. If the enable signal EN becomes high, the equalizing transistor 510 is turned on and the voltages on the data signal lines IO and /IO begin to be equalized. The second precharging transistor 531 of the second precharging circuit 530 is also turned on and the voltage on the second data signal line begins to increase. Since the precharge voltage IVC is applied to the gate of the fourth transistor 552 and turns the fourth transistor 552 on, the body voltage of the second precharging transistor 531 increases with the increasing voltage of the second data signal line /IO. This suppresses the increase of the threshold voltage Vth of the second precharging transistor 531 due to the body effect and in turn prevents degradation of driving capability of the second precharging transistor 531. Further, the second data signal line /IO voltage turns the third transistor 551 on, contributing to the increase of the body voltage of the second precharging transistor 531. That is, the third transistor 551 increases the body voltage of the second precharging transistor 531 in cooperation with the fourth transistor 552, thereby suppressing the increase of the threshold voltage Vth due to the body effect.

Next, the equalizing and precharging operation after the internal power supply voltage is applied to the second data signal line /IO and a ground voltage is applied to the first data signal line IO will be described. If the enable signal EN becomes high, the equalizing transistor 510 is turned on and the voltages on the data signal lines IO and /IO begin to be equalized. The first precharging transistor 521 of the first precharging circuit 520 is also turned on and the voltage on the first data signal line begins to increase. Since the precharge voltage IVC is applied to the gate of the second transistor 542 and turns the second transistor 542 on, the body voltage of the first precharging transistor 521 increases with the increasing voltage of the first data signal line. This suppresses the increase of the threshold voltage Vth of the first precharging transistor 521 due to the body effect and in turn prevents degradation of driving capability of the first precharging transistor 521.

The first data signal line IO voltage turns the first transistor 541 on, contributing to the increase of the body voltage of the first precharging transistor 521. That is, the first transistor 541 increases the body voltage of the first precharging transistor 521 in cooperation with the second transistor, thereby suppressing the increase of the threshold voltage Vth due to the body effect and preventing degradation of driving capability of the first precharging transistor 521.

That is, the body voltage of the transistors in the precharging circuit increases in the equalizing and precharge operation, thereby suppressing the increase of the threshold voltage Vth due to the body effect appearing in FIG. 1 and in turn increasing equalizing and precharging speed.

Figure 6:
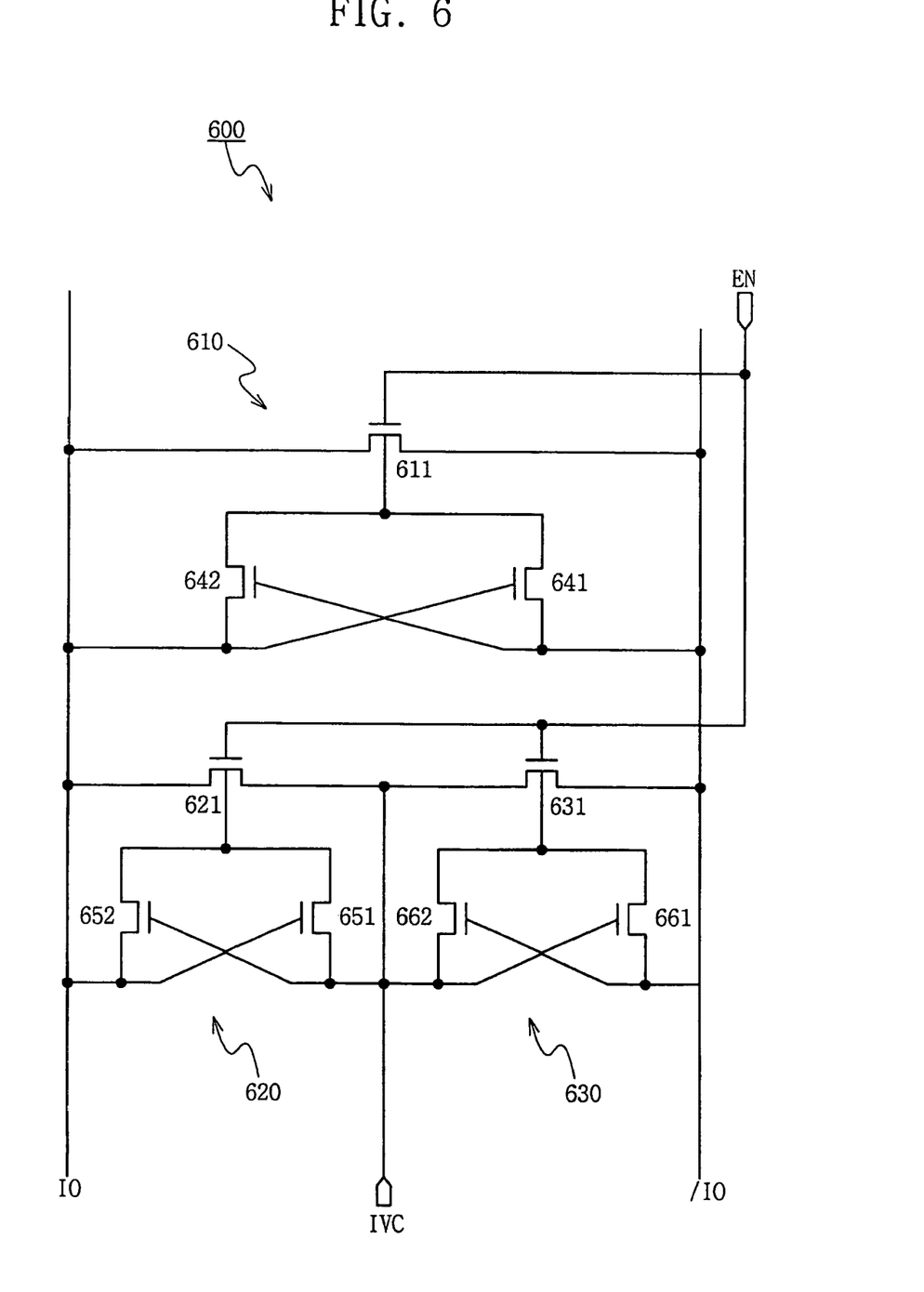
FIG. 6 is an electrical schematic of an equalization and precharge circuit according to an embodiment of the present invention.

FIG. 6 is a circuit diagram of an equalizing and precharging circuit 600 with both the equalizing circuit 200 of FIG. 2 and the precharging circuit 400 of FIG. 4. This circuit is the same as shown in FIG. 5 except that an equalizing transistor is substituted for the equalizing circuit of FIG. 2. Referring to FIG. 6, the equalizing and precharging circuit 600 comprises a first data signal line IO, a second data signal line /IO, an equalizing circuit 610, and first and second precharging circuits 620 and 630. The equalizing circuit 610 includes an equalizing transistor 611 for connecting between the first data signal line and the second data signal line in response to an enable signal EN, and a first body voltage control circuit 640. The first body voltage control circuit includes a first transistor 641 having a gate connected to the first data signal line, a first terminal connected to the second data signal line, and a second terminal connected to a body of the equalizing transistor; and a second transistor 642 having a gate connected to the second data signal line, a first terminal connected to the first data signal line, and a second terminal connected to the body of the equalizing transistor 611.

The first precharging circuit 620 includes a first precharging transistor 621 having a gate connected to the enable signal, a first terminal connected to the first data signal line, and a second terminal connected to the precharge voltage IVC; and a second body voltage control circuit. The second body voltage control circuit includes a third transistor 651 having a gate connected to the first data signal line, a first terminal connected to the precharge voltage IVC, and a second terminal connected to a body of the first precharging transistor; and a fourth transistor 652 having a gate connected to the precharge voltage, a first terminal connected the first signal line, and a second terminal connected to the body of the first precharging transistor.

The second precharging circuit 630 includes a second precharging transistor 631 having a gate connected to the enable signal, a first terminal connected to the second signal line, and a second terminal connected to the precharge voltage; and a third body voltage control circuit. The third body voltage control circuit includes a fifth transistor 661 having a gate connected to the second signal line, a first terminal connected to the precharge voltage, and a second terminal connected to a body of the second precharging transistor; and a sixth transistor 662 having a gate connected to the precharge voltage IVC, a first terminal connected to the second signal line, and a second terminal connected to the body of the second precharging transistor.

Operation of the equalizing and precharging circuit 600 of FIG. 6 will be described briefly since the operation is the same as the equalizing and precharging circuit 300 of FIG. 3 and the equalizing and precharging circuit 500 of FIG. 5.

As the enable signal becomes active and the equalizing and precharging operation is performed, the respective body voltages of the equalizing transistor 611 in the equalizing circuit 610, the first precharging transistor 621 in the first precharge circuit 620 and the second precharging transistor 631 in the second precharging circuit 630 increase with a feedback voltage on the data signal line equalized and precharged through the first, second and third body voltage control circuits. This suppresses the increase of the threshold voltage Vth due to the body effect appearing at the equalizing and precharging circuit 100 of FIG. 1, and in turn enhances an equalizing and precharging speed.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

Accordingly, as described above with respect to FIGS. 2–6, embodiments of the present invention include integrated circuit devices having signal lines therein that undergo precharge and/or equilibration operations. Referring again to FIG. 6, the integrated circuit device may include an equalization transistor 611 having first and second current carrying terminals (e.g., source and drain terminals) electrically coupled to first and second signal lines (IO and /IO), respectively, and a gate terminal responsive to an enable signal (EN). The integrated circuit device may also include a first body voltage control circuit. This control circuit includes a first transistor 642 having a first current carrying terminal electrically connected to the first signal line IO, a second current carrying terminal electrically connected to a body terminal of the equalization transistor 611 and a gate terminal electrically connected to the second signal line /IO. This first body voltage control circuit may operate to boost a voltage of the body terminal during an equalization time interval and thereby inhibit threshold voltage increases in the equalization transistor, which may limit operating speed of the integrated circuit device. The first body voltage control circuit may also include a second transistor 641 having a first current carrying terminal electrically connected to the second signal line /IO, a second current carrying terminal electrically connected to the body terminal of the equalization transistor 611 and a gate terminal electrically connected to the first signal line IO. In addition to the equalization transistor 611, the integrated circuit device may include a first precharge transistor 621 having a first current carrying terminal electrically connected to the first signal line IO, a second current carrying terminal electrically connected to a precharge voltage line IVC and a gate terminal responsive to the enable signal EN. A second body voltage control 620 circuit may accompany this first precharge transistor 621. This second body voltage control circuit 620 includes a first transistor 652 having a first current carrying terminal electrically connected to the first signal line IO, a second current carrying terminal electrically connected to a body terminal of the first precharge transistor 621 and a gate terminal electrically connected to the precharge voltage line IVC. The second body voltage control 620 circuit may also include a second transistor 651 having a first current carrying terminal electrically connected to the precharge voltage line IVC, a second current carrying terminal electrically connected to the body terminal of the first precharge transistor 621 and a gate terminal electrically connected to the first signal line IO.

Referring now to FIG. 4, an integrated circuit device may utilize a precharge transistor 410 having a first current carrying terminal electrically connected to a first signal line A, a second current carrying terminal electrically connected to a precharge voltage line IVC and a gate terminal responsive to an enable signal EN. A body voltage control circuit 420 is also provided to inhibit unwanted increases in the threshold voltage of the precharge transistor. This body voltage control circuit 420 includes a first transistor 422 having a first current carrying terminal electrically connected to the first signal line A, a second current carrying terminal electrically connected to a body terminal of the precharge transistor 410 and a gate terminal electrically connected to the precharge voltage line IVC. The body voltage control circuit 420 may also include a second transistor 421 having a first current carrying terminal electrically connected to the precharge voltage line IVC, a second current carrying terminal electrically connected to the body terminal of the precharge transistor 410 and a gate terminal electrically connected to the first signal line A.

Additional embodiments of the invention include methods of operating an integrated circuit devices. These methods may be used in memory devices that utilize differential data lines that may be driven rail-to-rail during writing, reading and other data transfer operations. In particular, the methods may include equilibrating voltages on a pair of complementary data lines (e.g., IO and /IO) using an equalization transistor 611 connected across the pair of complementary data lines. This operation is done simultaneously with raising a voltage on a body terminal of the equalization transistor 611 by electrically connecting the body terminal to a first one of the pair of complementary data lines. In particular, the step of equilibrating includes raising a voltage on a body terminal of the equalization transistor 611 by electrically connecting the body terminal to a first one of the pair of complementary data lines (e.g., /IO for the case where IO=1 and /IO=0) during a leading portion of an equalization time interval and electrically connecting the body terminal to a second one of the pair of complementary data lines (e.g., IO) during a trailing portion of the equalization time interval (before the enable signal is deactivated).

Finally, with respect to FIG. 4, additional methods of operating an integrated circuit device may include precharging a signal line A using a precharge transistor 410 connected between the signal line A and a precharge voltage line IVC while simultaneously raising a voltage on a body terminal of the precharge transistor by increasing a conductivity of an electrical connection (i.e., reducing a drain-to-source resistance of transistor 421) between the body terminal and the precharge voltage line in response to an increase in voltage on the signal line A.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit device, comprising:
   an equalization transistor having first and second current carrying terminals electrically coupled to first and second signal lines, respectively, which are complementary and a gate terminal responsive to an enable signal; and
   a first body voltage control circuit comprising a first transistor having a first current carrying terminal electrically connected to the first signal line, a second current carrying terminal electrically connected to a body terminal of said equalization transistor and a gate terminal electrically connected to the second signal line.

2. The device of claim 1, wherein the first and second signal lines represent a pair of complementary data lines associated with a memory device.

3. The device of claim 2, further comprising:
a first precharge transistor having a first current carrying terminal electrically connected to the first signal line, a second current carrying terminal electrically connected to a precharge voltage line and a gate terminal responsive to the enable signal.

4. The device of claim 3, further comprising:
a second body voltage control circuit comprising a first transistor having a first current carrying terminal electrically connected to the first signal line, a second current carrying terminal electrically connected to a body terminal of said first precharge transistor and a gate terminal electrically connected to the precharge voltage line.

5. The device of claim 4, wherein said second body voltage control circuit further comprises a second transistor having a first current carrying terminal electrically connected to the precharge voltage line, a second current carrying terminal electrically connected to the body terminal of said first precharge transistor and a gate terminal electrically connected to the first signal line.

6. The device of claim 4, further comprising:
a second precharge transistor having a first current carrying terminal electrically connected to the second signal line, a second current carrying terminal electrically connected to the precharge voltage line and a gate terminal responsive to the enable signal.

7. The device of claim 6, further comprising:
a third body voltage control circuit comprising a first transistor having a first current carrying terminal electrically connected to the second signal line, a second current carrying terminal electrically connected to a body terminal of said second precharge transistor and a gate terminal electrically connected to the precharge voltage line.

8. The device of claim 7, wherein said third body voltage control circuit further comprises a second transistor having a first current carrying terminal electrically connected to the precharge voltage line, a second current carrying terminal electrically connected to the body terminal of said second precharge transistor and a gate terminal electrically connected to the second signal line.

9. The device of claim 1, wherein said first body voltage control circuit further comprises:
a second transistor having a first current carrying terminal electrically connected to the second signal line, a second current carrying terminal electrically connected to the body terminal of said equalization transistor and a gate terminal electrically connected to the first signal line.

10. The device of claim 9, wherein the first and second signal lines represent a pair of complementary data lines associated with a memory device.

11. An integrated circuit device, comprising:
a precharge transistor having a first current carrying terminal electrically connected to a first signal line, a second current carrying terminal electrically connected to a precharge voltage line and a gate terminal responsive to an enable signal; and
a body voltage control circuit comprising a first transistor having a first current carrying terminal electrically connected to the first signal line, a second current carrying terminal electrically connected to a body terminal of said precharge transistor and a gate terminal electrically connected to the precharge voltage line.

12. The device of claim 11, wherein said body voltage control circuit further comprises a second transistor having a first current carrying terminal electrically connected to the precharge voltage line, a second current carrying terminal electrically connected to the body terminal of said precharge transistor and a gate terminal electrically connected to the first signal line.

13. A method of operating an integrated circuit device, comprising the step of:
equilibrating voltages on a pair of complementary data lines using an equalization transistor connected across the pair of complementary data lines while simultaneously raising a voltage on a body terminal of the equalization transistor by electrically connecting the body terminal to a first one of the pair of complementary data lines.

14. The method of claim 13, wherein said equilibrating step comprises raising a voltage on a body terminal of the equalization transistor by electrically connecting the body terminal to a first one of the pair of complementary data lines during a leading portion of an equalization time interval and electrically connecting the body terminal to a second one of the pair of complementary data lines during a trailing portion of the equalization time interval.

15. A method of operating an integrated circuit device, comprising the step of:
precharging a signal line using a precharge transistor connected between the signal line and a precharge voltage line while simultaneously raising a voltage on a body terminal of the precharge transistor by increasing a conductivity of an electrical connection between the body terminal and the precharge voltage line in response to an increase in voltage on the signal line.

* * * * *